United States Patent [19]
Habuka et al.

[11] Patent Number: 5,749,974
[45] Date of Patent: May 12, 1998

[54] METHOD OF CHEMICAL VAPOR DEPOSITION AND REACTOR THEREFOR

[75] Inventors: Hitoshi Habuka; Masanori Mayuzumi, both of Gunma-ken, Japan; Naoto Tate, Camas, Wash.; Masatake Katayama, Gunma-ken, Japan

[73] Assignee: Shin-Etsu Handotai Co., Ltd., Tokyo, Japan

[21] Appl. No.: 502,042

[22] Filed: Jul. 13, 1995

[30] Foreign Application Priority Data

Jul. 15, 1994 [JP] Japan ................... 6-186460

[51] Int. Cl.$^6$ ................................. C23C 16/00
[52] U.S. Cl. ................ 118/725; 118/724; 118/715
[58] Field of Search ............... 118/715, 724, 118/725

[56] References Cited

U.S. PATENT DOCUMENTS

| | | | |
|---|---|---|---|
| 3,338,209 | 8/1967 | Bhola | 118/49.5 |
| 3,805,736 | 4/1974 | Foehring | 118/49 |
| 4,533,820 | 8/1985 | Shimizu | 219/411 |
| 4,689,247 | 8/1987 | Doty et al. | 427/126.1 |
| 4,846,102 | 7/1989 | Ozias | 118/730 |
| 5,044,315 | 9/1991 | Ozias | 427/719 |
| 5,077,875 | 1/1992 | Hoke | 29/25.01 |
| 5,085,887 | 2/1992 | Adams | 427/55 |
| 5,194,401 | 3/1993 | Adams | 437/173 |
| 5,221,556 | 6/1993 | Hawkins | 427/725 |
| 5,244,694 | 9/1993 | Ozias | 427/248.1 |
| 5,261,960 | 11/1993 | Ozias | 118/715 |
| 5,336,327 | 8/1994 | Lee | 118/730 |
| 5,370,738 | 12/1994 | Watanabe | 118/725 |
| 5,405,446 | 4/1995 | Nakajima | 118/719 |
| 5,411,590 | 5/1995 | Hawkins | 118/715 |
| 5,458,918 | 10/1995 | Hawkins | 427/248.1 |
| 5,525,157 | 6/1996 | Hawkins | 118/715 |
| 5,576,059 | 11/1996 | Beinglass et al. | 427/255 |
| 5,587,019 | 12/1996 | Fujie | 118/725 |

FOREIGN PATENT DOCUMENTS

| | | |
|---|---|---|
| 2 661 554 | 10/1991 | France. |
| WO91/03075 | 3/1991 | WIPO. |

OTHER PUBLICATIONS

Journal of the Electrochemical Society, Mar. 1982 vol. 139, No. 2; p. 583; N. Nordell et al.
Journal of the Electrochemical Society, Mar. 1982 vol. 129, No. 3; pp. 634–644; L. J. Giling.
2nd International Atomic Layer Epitaxy Symposium, Raleigh, NC, Jun. 2-5, 1992; Thin Solid Films, Mar. 25, 1993; pp. 74–77; M. Ishizaki et al.

*Primary Examiner*—R. Bruce Breneman
*Assistant Examiner*—Jeffrie R. Lund
*Attorney, Agent, or Firm*—Barnes & Thornburg

[57] ABSTRACT

A reactor for chemical vapor deposition which is capable of producing semiconductor crystalline thin films having small transition widths. The reactor includes a cold-wall type reaction chamber that is equipped with a gas inlet at one end and a gas outlet at the other end and a semiconductor substrate support which supports a semiconductor substrate so that a main surface thereof is horizontal. A reactant gas is caused to flow horizontally through the reaction chamber to effect the growing of a crystalline thin film on the main surface of the semiconductor substrate. The semiconductor substrate is arranged within the reactor chamber within a distance W which is measured from a leading edge of the semiconductor substrate at a most upstream position along a direction toward the gas outlet where W indicates an internal width of the reaction chamber. The semiconductor substrate is also in a location having a W/G ratio of 15 or greater, where G represents a distance between the main surface of the semiconductor substrate and a ceiling of the reaction chamber.

4 Claims, 4 Drawing Sheets

5,749,974

1

METHOD OF CHEMICAL VAPOR DEPOSITION AND REACTOR THEREFOR

BACKGROUND OF THE INVENTION

1. Field of the Invention

The present invention relates to a method of a chemical vapor deposition, where a reactant raw material gas(es) is transported onto a semiconductor crystalline substrate(s) to grow a semiconductor crystalline thin film(s) thereon, and to a reactor therefor.

2. Description of the Prior Art

A horizontal chemical vapor deposition reactor, as shown conceptually in a simplified form in FIG. 6, is comprised of a cold-wall type reaction chamber 3 being composed of a gas inlet 5 for a reactant raw material gas(es) 4 at one end and a gas outlet 6 at the other end being aligned horizontally and holding a semiconductor crystalline substrate(s) 1 (hereafter simply referred to as a substrate) roughly horizontally in the chamber 3, and grows a desired semiconductor thin film(s) 2 on the substrate(s) 1, while the substrate(s) 1 is heated and the reactant raw material gas(es) 4 is flown through the substrates) 1 in one direction in the reaction chamber 3.

In a horizontal reactor for a chemical vapor deposition of the prior art, as shown conceptually in a simplified form as well in FIG. 7, which is a front view of the chamber 3 in section shown in FIG. 6 as seen from the side of the gas inlet 5, the internal height H of the chamber 3 is so determined as to accommodate a susceptor (not shown) laid on the bottom of the reaction chamber 3 on which a substrates) 1 is held and a mechanical driving device for a substrate transportation (both not shown)

With respect to the internal width W of the chamber 3 as shown in FIG. 7, it is so determined that a proper gap is added to a diameter of a susceptor (not shown) or a diameter D of a substrates) 1 thereon for receiving or drawing out.

In a chemical vapor deposition using a traditional type of the reaction chamber 3 designed in such a manner as described above, when, in particular, a low impurity content semiconductor thin film(s) 2 is grown on a substrates) 1 having a high impurity content whose concentration is higher than that of the thin film(s) 2 by at least two figures, a transition width T located at the interface between the substrate 1 and the semiconductor thin film 2, where the impurity level in the semiconductor thin film 2 changes gradually from the concentration of the substrate 1 to a desired concentration, is unfavorably spread and thus many trials have been carried out to reduce the transition width T.

To find a better condition for minimizing the transition width T, there have to be done a study about the causes of the transition width T. Traditionally two causes have been raised for the formation of the transition width T, which are out-diffusion O in a solid and autodoping A.

The out-diffusion O in a solid is a phenomenon that an impurity diffuses into a semiconductor thin film 2 from a substrate 1 depending on a growth temperature of the semiconductor thin film 2.

This phenomenon is always dependent on impurity concentration, heating temperature and heating time.

To diminish the phenomenon, one of two ways is chosen, either lowering temperature or shortening heating time.

However, when the heating temperature is lowered in order to suppress the out-diffusion O, automatically affecting to the growth rate to be lowered by itself, the growth rate is required to be reduced further to prevent the surface appearance of a crystalline thin film from roughening.

2

Under the conditions, the growth time (in other words, the heating time extended to attain a desired thickness of the film), causes not only the enhancement of the out-diffusion in a solid, which reduces the suppression effect of the out-diffusion, but also the reduction of the production efficiency.

On the other hand, the autodoping A is a phenomenon that an impurity moved out from the substrate 1 into the gas phase therearound is incorporated back into the growing surface of a semiconductor crystalline thin film 2.

This phenomenon is also able to be suppressed by either lowering heating temperature or by shortening heating time.

But, both of the means are not better ways to be adopted, because as same as the case of the out-diffusion O mentioned above, both of the means give only small suppression effect to the autodoping A, and also cause a decrease of the production efficiency by lowering the growth rate.

In company with the recent general trend of increasingly higher integrated electronic devices using the semiconductor single crystalline thin films produced by a gas phase epitaxial deposition, much thinner semiconductor crystalline film has been required, and more recently, there has arose a new requirement that the film thickness is equal to or thinner than the transition width T of generally available in the past.

SUMMARY OF THE INVENTION

It is an object of the present invention to provide a method of a chemical vapor deposition and a reactor therefor, whereby a semiconductor crystalline film having a transition width smaller than that grown by the traditional chemical vapor deposition technique is obtained in the same reaction condition.

The present invention is directed to a method of chemical vapor deposition which is conducted in a cold-wall type reaction chamber that is equipped with a gas inlet for a reactant raw material gas(es) at one end and a gas outlet for a reaction gas at the other end, installed in roughly horizontal, holding a semiconductor substrate(s) in the chamber with a main surface of the substrate aligned in roughly horizontal, flowing a reactant raw material gas(es) in roughly horizontal in one direction, and growing a desired semiconductor crystalline thin film(s) on the heated semiconductor substrates), characterized in that the substrate(s) is arranged in a range of (L+W) from the gas inlet of the reactant raw material gas(es) in the flowing direction and in a location of W/G ratio is 15 or larger, where W indicates an internal width of the reaction chamber, L indicates a distance from the gas inlet of the reactant raw material gas(es) to the leading edge of the substrate located at the most upstream position on the inlet side and G indicates the distance between the main surface of the substrate and a ceiling thereabove.

The present invention is further directed to a method of chemical vapor deposition which is characterized in that the semiconductor substrate(s) is so selected that the diameter thereof is less than the internal width W of the reaction chamber.

The present invention is further directed to a method of chemical vapor deposition which is characterized in that each of the gaps between the semiconductor substrate(s) and the internal side walls is so selected as to be 3 cm or wider.

The present invention is further directed to a reactor for chemical vapor deposition which is comprised of a cold-wall type reaction chamber that is equipped with a gas inlet for a reactant raw material gas(es) at one end and a gas outlet for a reaction gas at the other end, installed in roughly horizontal, and a supporting means for a semiconductor substrate(s) being held in the chamber with a main surface of the substrate aligned in roughly horizontal, flowing a reactant raw material gas(es) in roughly horizontal in one direction, and growing a desired semiconductor crystalline thin film(s) on the heated semiconductor substrate(s), characterized in that the supporting means for the substrate(s) is arranged in a range of (L+W) from the gas inlet of the reactant raw material gas(es) in the flowing direction and in a location of W/G ratio is 15 or larger, where W indicates an internal width of the reaction chamber, L indicates a distance from the gas inlet of the reactant raw material gas(es) to the leading edge of the substrate located at the most upstream position on the gas inlet side and G indicates the distance between the main surface of the substrate and a ceiling thereabove.

The present invention is further directed to a reactor for chemical vapor deposition which is comprised of a cold-wall type reaction chamber that is equipped with a gas inlet for a reactant raw material gas(es) at one end and a gas outlet for a reaction gas at the other end, installed in roughly horizontal, and a supporting means for a semiconductor substrates) being held in the chamber with a main surface of the substrate aligned in roughly horizontal, flowing a reactant raw material gas(es) in roughly horizontal in one direction, and growing a desired semiconductor crystalline thin film(s) on the heated semiconductor substrate(s), characterized in that the dimensions of the reaction chamber are so selected that the internal length thereof in the flowing direction of the reactant raw material gas(es) is longer than (L+W) and W/H ratio is 15 or larger, where W indicates an internal width of the reaction chamber, H indicates an internal height of the chamber, L indicates a distance from the gas inlet of the reactant raw material gas(es) to the leading edge of the substrate located at the most upstream position on the gas inlet side.

BRIEF DESCRIPTION OF THE DRAWINGS

Other features and objects of the present invention will become apparent from a study of the following description of a method of a chemical vapor deposition and a reactor therefor, whereby a semiconductor crystalline film having a transition width smaller than that to be obtained by the traditional chemical vapor deposition technique in the same reaction conditions, together with the accompanying drawings, of which.

FIGA. 1(a)–(c) are conceptual representations of a main part in a reactor for a chemical vapor deposition according to a first embodiment of the present invention and, in particular.

DETAILED DESCRIPTION OF THE PREFERRED EMBODIMENTS

There will be calculative and preliminary experimental results described concerning about the autodoping phenomenon.

The inventors have investigated about the autodoping phenomenon, which is one of the causes of increasing a transition width, by using a horizontal type reactor for a chemical vapor deposition.

The details of the investigation are as follows: In a cold-wall type reaction chamber aligned almost in horizontal holding a substrate(s) therein, when a reactant raw material gas(es) is led into the chamber being flown over the substrate almost in horizontal and in one direction, while heating the substrate for growing a crystalline thin film thereon, vortexes due to natural convection generated by a temperature difference between the reaction chamber and the heated area carry an impurity which was moved out from the substrate, in particular, from the backside thereof and then return the impurity to the neighboring point of the substrate in each time when the vortexes have chances to be incorporated with the growing surface of the crystalline thin film.

The inventors have found that the vortexes carrying a impurity from the substrate are one of the causes of the autodoping phenomenon.

Figure 6:
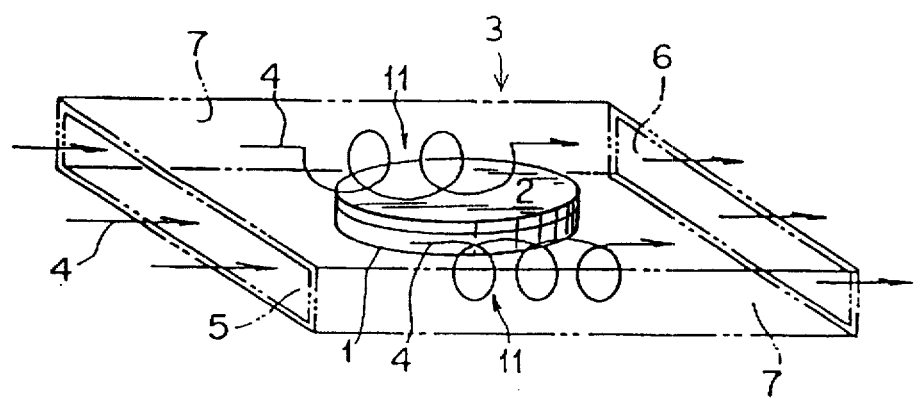
FIG. 6 is a perspective view illustrating a stream pattern of a natural convection of a reactant raw material gas(es) generated in a traditional horizontal type reactor for a chemical vapor deposition.
Figure 7:
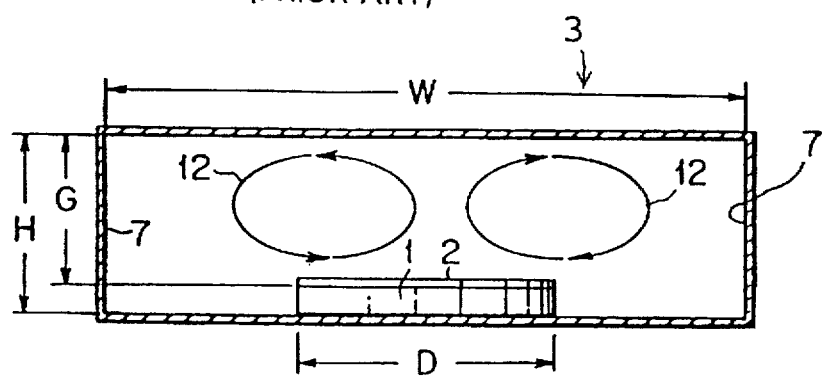
FIG. 7 is a sectional plane view of FIG. 6 illustrating a stream pattern of vertical vortexes of reactant raw material gases generated in the reaction chamber.

In a traditional type of a horizontal reactor for a chemical vapor deposition as shown in FIGS. 6 and 7, which has a large space above a substrate 1 in the reaction chamber 3, large vertical vortexes 12 due to natural convection 11 are generated in such a manner that a part of the reactant raw material gas 4 is being moved upward above the central region of the heated substrate 1 and moved downward in the vicinity of the cooled side walls 7 of the chamber 3 as the reactant raw material gas 4 is flowing inside the chamber 3 toward the downstream.

By a theoretical analysis through calculations using Grashof number and Rayleigh number as parameters on the basis of the hydrodynamics, a generation frequency of the vertical vortexes 12 due to natural convection 11 is found proportional to the third power of the internal height H of the reaction chamber 3 on an assumed condition that the substrate 1 is held directly on the internal bottom surface of the reaction chamber 3.

When a space above the substrate 1 is wider, the impurity in the natural convection originated from the substrate 1 increases the probability to be incorporated with the substrate 1, resulting larger autodoping and wider transition width.

In a horizontal type reactor for a chemical vapor deposition comprising a cold wall type reaction chamber, a series of experiments to grow semiconductor crystalline thin films 2 have been carried out by narrowing the distance G between the main surface of a substrate 1 and the ceiling of the reaction chamber 3 gradually for measuring each transition width at each distance G, and at the same time, rotation number of a vortex 12 under each condition was estimated by calculations and gas flow visualization experiments.

Both of the rotation number of the vortex and the transition width were studied on the relations with W/G ratio, where W/G ratio indicates the ratio of the internal width W of the reaction chamber 3 to the distance G between the main surface of the substrate 1 and the ceiling thereabove.

One of the results of the study showed that in the case when an internal width W of a reaction chamber 3 was 40 cm in length, a distance G of 2 cm between a main surface of a substrate 1 and the ceiling thereabove, that is, W/G ratio was 20, the rotation number of the vortex 12 due to natural convection 11 generated above the substrate 1 in the passage of a mixture of raw material gases 4 over a heated region, whose diameter was 30 cm, was suppressed to about 0.5 rotations.

In FIGS. 6 and 7, the internal width W is a distance between the both internal walls 7, 7 of the reaction chamber 3.

A study covering several experiments showed that in the case when W/G ratio was 15 or larger, the rotation number of the vertical vortex 12 was suppressed to 1 or less within the distance of (L+W) in the flowing direction of the raw material gases 4 and therefore the autodoping phenomenon was reduced to be as small as negligible, where L indicates a distance from the gas inlet 5 for the reactant raw material gases 4 to the leading edge of the substrate 1 located at the most upstream position on the inlet side.

When W/H ratio is selected at 15 or larger, since the substrate 1 is held in the reaction chamber 3, W/G ratio is automatically regulated to 15 or larger, where H indicates the internal height of the reaction chamber 3 at the position where the substrate 1 is held.

As mentioned above, when W/G ratio or W/H ratio is selected to be 15 or larger and the distance G between the main surface of the substrate 1 and the ceiling thereabove is reduced, the rotation number of a vertical vortex 12 due to natural convection 11 is suppressed above a heated region within the distance of (L+W) from the gas inlet 5 in the flowing direction of the reactant raw material gases 4, resulting in the facts that the autodoping phenomenon is suppressed to be as small as negligible and thereby the transition width T is decreased.

On the other hand, a stagnant layer of the reactant raw material gases 4 is formed in the vicinity of all the sidewalls 7, 7 of the reaction chamber 3, where the flow rate is very low.

The thickness of the stagnant layer is found to be 3 cm at the highest and has no relation to the internal width W of the reaction chamber 3 or the diameter D of the substrate 1 held inside the chamber 3.

When an impurity migrates from a substrate 1, in particular from the back surface thereof, into the stagnant layer, the probability of autodoping is high because the impurity stays long in the stagnant layer where the flow rate is low.

Consequently, when a chemical vapor deposition is carried out in the condition that both of the outer sides of the substrate 1 are separated from the internal walls 7, 7 by 3 cm or wider in length respectively, since any part of the substrate 1 is not located within the stagnant layer site, none of the autodoping originated from the stagnant layer is generated, so that the entire substrate 1 is kept the same environmental condition with respect to the flow of the reactant raw material gases 4.

Next, detail embodiments of the reactor operated under normal atmospheric pressure according to the present invention will be explained in reference to the accompanying drawings.

Embodiment 1

Figure 1A:
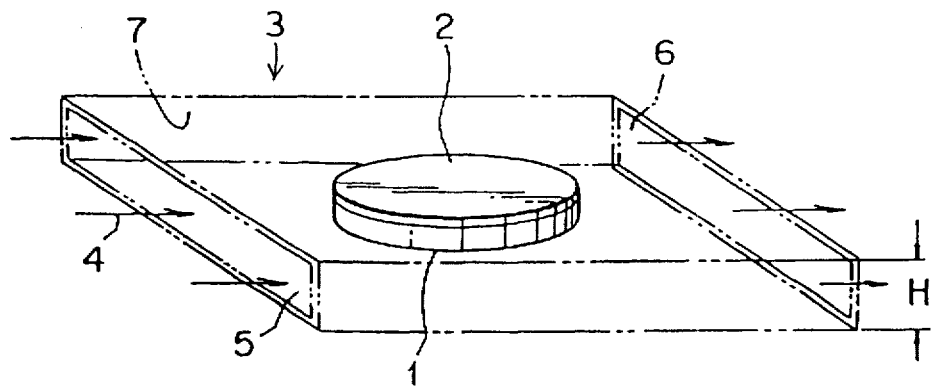
FIG. 1(a) is a perspective view of a reaction chamber.
Figure 1B:
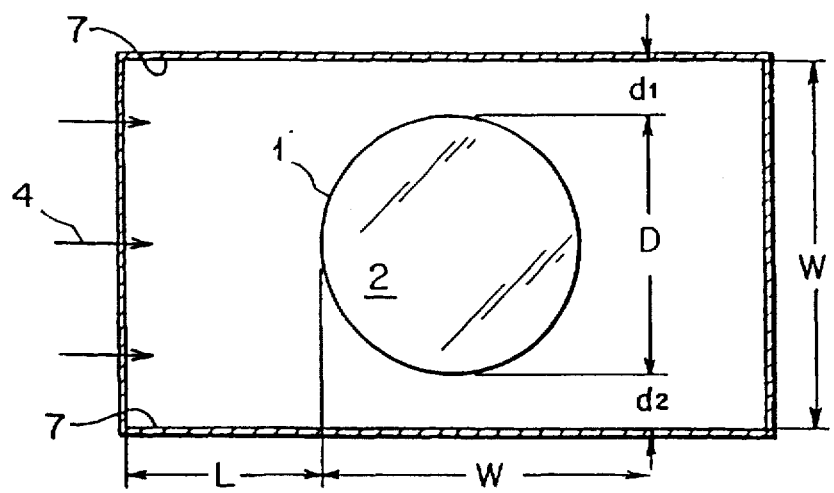
FIG. 1(b) is a top plane view thereof and FIG. 1(c) is a vertical sectional view thereof.
Figure 1C:
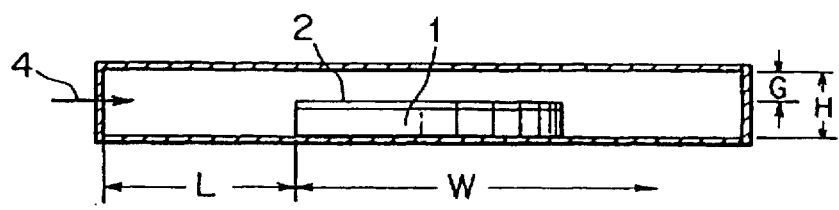

FIG. 1 is conceptual representations of a main part in a reactor for a chemical vapor deposition according to a first embodiment of the present invention and, in particular, FIG. 1(a) is a perspective view of a reaction chamber 3, FIG. 1(b) is a top plane view thereof and FIG. 1(c) is a vertical sectional view thereof.

A substrate 1 is placed in a reaction chamber 3 and a mixture of reactant raw material gases 4 flows over the substrate 1 heated at a desired temperature to grow a semiconductor crystalline thin film 2 on the substrate 1. There are several methods to heat up the substrate 1 to a desired temperature, such as, a method to provide a radiation energy like infrared rays to the substrate 1 through reaction chamber walls, a method to have a resistance heater inserted beneath the substrate 1 and heated by electricity, a method to have a induction heater beneath the substrate 1.

When a semiconductor, such as, a silicon crystalline thin film 2 is grown by a chemical vapor deposition, walls 7, 7 of the reaction chamber 3 are kept at a low temperature in order that semiconductor crystal does not deposit on the internal surfaces of the walls, while the substrate 1 is heated.

Under such a reaction environment, only the substrate 1 is heated to a high temperature, while the area around the substrate 1 remains at a temperature a little higher than room temperature.

A chamber that produces such a temperature environment around the substrate 1 is generally called as a cold-type chamber.

Natural convection 11 is apt to occur inside the cold-type chamber due to the great temperature difference between a substrate 1 and the walls of a reaction chamber 3.

A series of silicon single crystalline thin films were grown on silicon crystalline substrates in the first embodiment of the reactor for a chemical vapor deposition of the present invention and the results were described below in detail.

A silicon single crystalline substrate 1, which had a conductance of p-type, a resistivity of about 0.02 ohm·cm and a diameter D of 20 cm, was placed on a susceptor, not shown, in the reaction chamber 3 and heated up to 1100° C., where the susceptor has a diameter of a little smaller than the internal width of the reaction chamber 3.

The configuration of the reaction chamber 3 for a chemical vapor deposition in the first embodiment was set as follows; the distance L from a gas inlet 5 for a mixture of reactant raw material gases 4 to the leading edge of the substrate 1 was 20 cm, the gap d1, d2 between the internal side walls 7, 7 of the reaction chamber 3 and the nearest portions of the outer edge of the substrate 1 was 5 cm each, the internal width W of the chamber 3 was 30 cm, the distance G between the main surface of the substrate 1 and the ceiling of the chamber thereabove was so selected as to change gradually in the range of 1.5 cm to 6 cm, which means W/G ratio was in a range of 5 to 20.

A series of vapor phase epitaxial growths were conducted under the following conditions.

A mixture of reactant raw material gases 4 was prepared by mixing 3.6 l/min. of trichlorosilane gas with hydrogen gas and the mixture was supplied horizontally into the reaction chamber 3 in one direction at a flow rate of 100 l/min. through the gas inlet 5 of the reaction chamber 3.

In this condition, the rotation number of each of vortexes was determined by calculations on the basis of hydrodynamics and visualization experiments so as to study a relation between the rotation number and W/G ratio, where the vortexes were generated due to natural convection of reactant raw material gases 4 on the susceptor as a heated region, while the mixture of raw material gases 4 flowed above the substrate.

Figure 2:
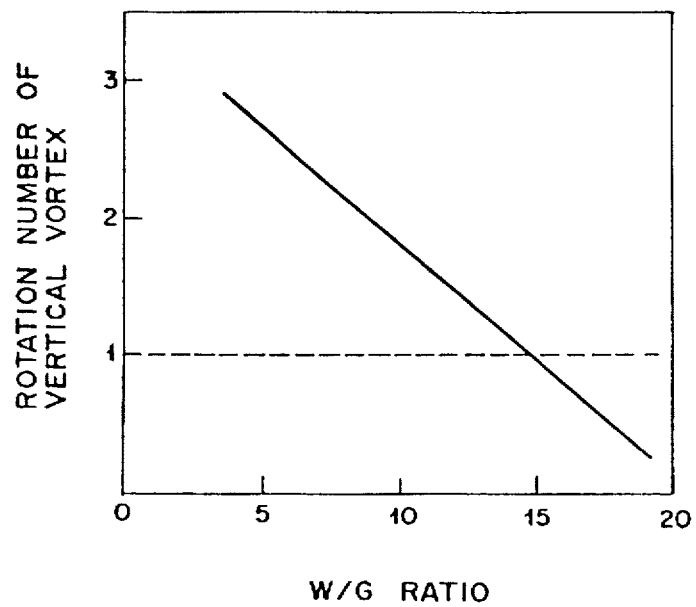
FIG. 2 is a graph showing experimental results of vapor phase epitaxial growths conducted in a first embodiment about a relation between W/G ratio in a reaction chamber and rotation number of a vertical vortex that is generated by a natural convection during a passage of a reactant raw material gas(es) over a heated region.

As clearly shown in FIG. 2. it was found that the rotation number N of the vertical vortexes 12 became 1 rotation or less when W/G ratio was 15 or larger.

This means that a condition is achievable in which an impurity moved out from the very leading edge of the substrate 1 into the surrounding gas phase does not incorporate back into the single crystalline thin film 2.

Then, to verify the practical effect of aforementioned conditions, a series of silicon single crystalline thin films 2 were grown to measure a transition width for each condition.

The growth conditions were essentially the same as those of the aforementioned experiments on the investigation about the vertical vortexes 12.

In theses experiments, substrates 1 were exposed in a hydrogen atmosphere at 1190° C. for 90 seconds in order to clean the surfaces of the substrates 1 prior to the growth of the silicon single crystalline films 2.

A period of time when a trichlorosilane mixed reaction gas is introduced into a reaction chamber 3 to grow a silicon single crystalline thin film 2 was set to be 1 min.

Diborane as a dopant gas was mixed into the reactant raw material gas so that the resistivity of the silicon single crystalline thin film 2 is controlled to be 10-ohm cm in p-type.

In the above growth conditions, each of the silicon single crystalline thin films 2 grown to be about 3 μm in thickness was measured by a secondary ion mass spectroscopy (SIMS) to investigate dopant concentration profile in the silicon single crystalline thin films 2 formed on the substrates 1.

Figure 3:
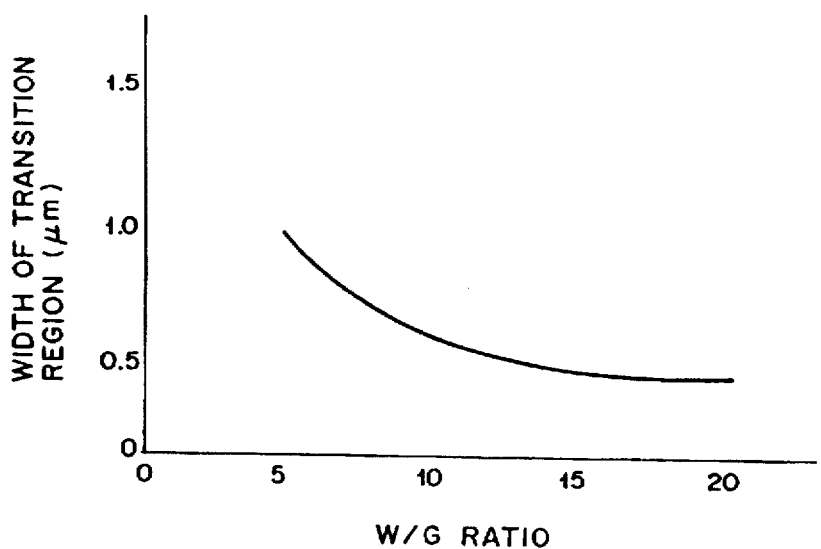
FIG. 3 is another graph showing experimental results of vapor phase epitaxial growths conducted in a first embodiment about a relation between W/G ratio in a reaction chamber and transition region width of a semiconductor crystalline thin film.

A relation between the transition width and W/G ratio was shown in FIG. 3.

It was found from the FIG. 3 that the transition width was changed in a correlating manner to the change of W/G ratio, even if the condition of the reactant raw material gas was kept the same, and the transition width was not lowered to a value of less than 0.5 μm.

The lowest value of the transition width was determined by an out-diffusion in a solid occurred during the pretreatment for cleaning a surface of a substrate 1 and the following growth of a semiconductor crystalline thin film 2.

That is, it was found that a silicon single crystalline thin film 2, in which the influence of autodoping was suppressed as small as negligible and the transition width was small as the result, could be grown, when a W/G ratio was selected to be 15 or larger.

Embodiment 2

Figure 4:
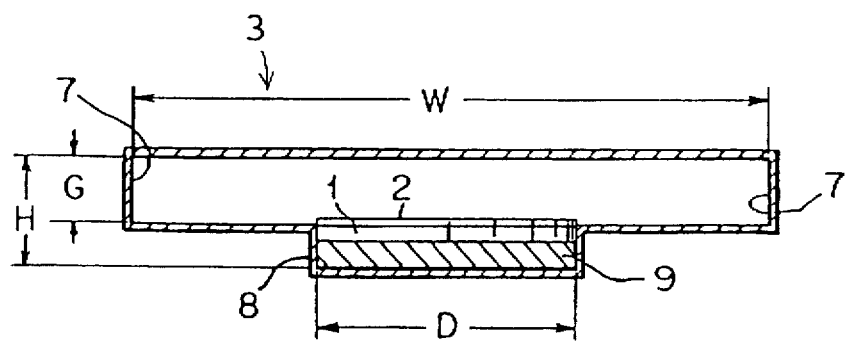
FIG. 4 is a schematic sectional view of a reaction chamber in a second embodiment.
Figure 5:
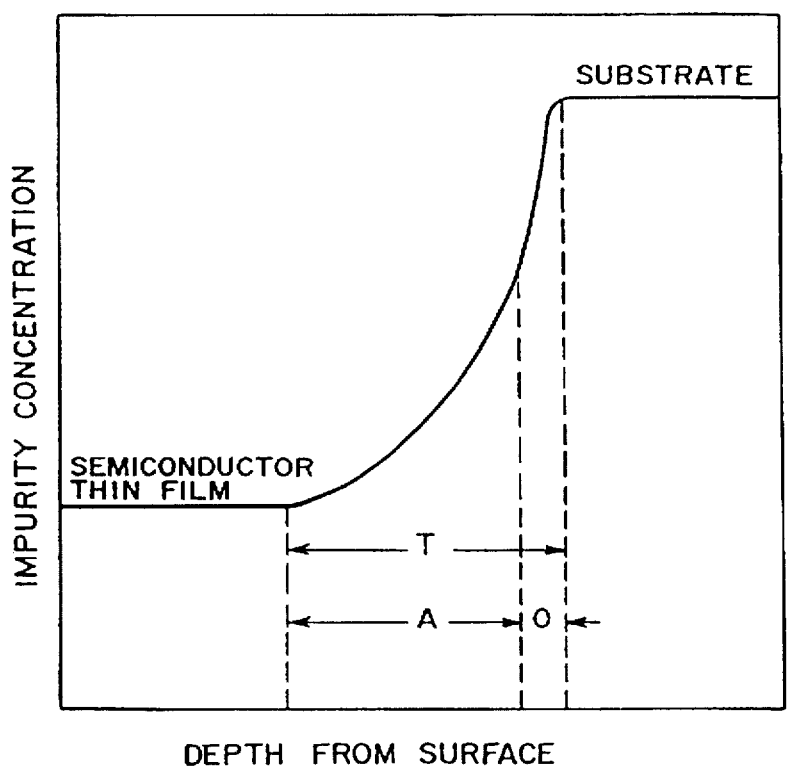
FIG. 5 is an impurity concentration profile in the thickness direction.

FIG. 4 is a schematic sectional view of the reaction chamber 3 in the reactor of a second embodiment.

The reaction chamber 3 has a recess at a part of the bottom and a susceptor 9 is located in the recess 8.

The W/G ratio is selected to be 15 or larger, where G indicates the distance from the main surface of a substrate 1 held on the susceptor 9 to the ceiling thereabove.

In the reaction chamber 3, because a main surface of a substrate 1 is leveled with the internal bottom surface other than the recess 8, when the substrate 1 is placed on the susceptor 9, a mixture of raw material gases 4 flows smoothly without any obstruction to the flow at the leading edge of the substrate 1 as well as at the leading edge of the susceptor 9, so that a disturbance in the stream of the mixture of raw material gases 4 becomes scarce to occur and thus the objects of the present invention can be achieved for certain.

On the other hand, it may be possible to suppress a natural convection occurring between the main surface of a substrate and the ceiling thereabove by the effect of an increased flow rate of a gas.

But an extremely large flow rate is required in order to effectively minimize the influence of autodoping.

That is to say, to try to minimize a transition width by an increased gas flow rate is never a recommendable way from a view point of the production cost of a wafer with a chemical vapor deposition thin film thereon.

The detailed description was made in the embodiments 1 and 2 about a vapor phase epitaxial growth conducted to grow a silicon single crystalline thin film on a silicon single crystalline substrate.

The present invention is, however, not limited to the embodiments above and it is needless to say that a variety of modifications can be made in other embodiments still within the scope of the present invention.

For example, a single substrate is used for explaining the above embodiments 1 and 2, but the present invention can naturally be applicable to the cases where a plurality of substrates are held in a reaction chamber only if they are located within an interval of (L+W) from the gas inlet of a reactant raw material gas(es) in the gas flowing direction.

The present invention is also effective to grow a polycrystalline thin film on a substrate by a chemical vapor deposition.

In the method of a chemical vapor deposition and a reactor therefor according to the present invention, as is made clear from the explanation above, a space above a substrate held in the reaction chamber is designed to be small and the location of a substrate(s) is arranged within a certain interval in the reaction chamber, and thus the occurrence of natural convection in the space is suppressed.

The suppression effect of natural convection in the space is effective to minimize autodoping caused by an impurity coming out from such as a back surface of a substrate during a chemical vapor deposition and thus the transition width on a substrate is uniformly suppressed across the entire surface of the substrate.

What is claimed is:

1. A chemical vapor deposition reactor comprising:
   a cold-wall type reaction chamber for growing a silicon crystalline thin film, said reaction chamber being equipped with a reactant gas inlet at an upstream end and a reactant gas outlet at a downstream end for flowing a reactant gas horizontally in one direction through said reaction chamber;

means for supporting a semiconductor substrate in said reaction chamber so that a main surface of the semiconductor substrate is aligned horizontally;

means for heating the semiconductor substrate to a temperature for growing a silicon crystalline film on the semiconductor substrate, said temperature being sufficient to create natural convection between the semiconductor substrate and internal side walls of the reaction chamber due to temperature differences therebetween;

wherein the semiconductor substrate is arranged within a distance W measured from a leading edge of the semiconductor substrate which leading edge is located at a most upstream portion of the reaction chamber, along a direction toward said gas outlet, and the semiconductor substrate is arranged in a location in which a W/G ratio is 15 or larger so that a rotation number of a vertical vortex due to natural convection is suppressed to 1 or less within the distance W measured from a leading edge of the semiconductor substrate and, wherein W is an internal width of said reaction chamber and G is a distance between the main surface of the at least one semiconductor substrate and a ceiling of said reaction chamber above the at least one semiconductor substrate.

2. A chemical vapor deposition reactor according to claim 1, wherein said means for supporting the at least one semiconductor substrate in said reaction chamber positions the at least one semiconductor substrate at least 3 cm from internal side walls thereof.

3. A chemical vapor deposition reactor comprising:

a cold-wall type reaction chamber for growing a silicon crystalline thin film, said reaction chamber being equipped with a reactant gas inlet at an upstream end and a reactant gas outlet at a downstream end for flowing a reactant gas horizontally in one direction through said reaction chamber;

means for supporting a semiconductor substrate in said reaction chamber so that a main surface of the semiconductor substrate is aligned horizontally, means for heating the semiconductor substrate to a temperature for growing a silicon crystalline film on the semiconductor substrate, said temperature being sufficient to create natural connection between the semiconductor substrate and internal side walls of the reaction chamber due to temperature differences therebetween;

wherein an internal length of said reaction chamber as measured along a direction which extends between said gas inlet and said gas outlet is greater than W, and a W/H ratio of said reaction chamber is 15 or larger, so that a rotation number of a vertical vortex due to natural convection is suppressed to 1 or less within the distance W measured from a leading edge of the semiconductor substrate, and wherein W is an internal width of said reaction chamber and H is an internal height of said reaction chamber.

4. A chemical vapor deposition reactor according to claim 3, wherein said means for supporting the at least one semiconductor substrate in said reaction chamber positions the at least one semiconductor substrate at least 3 cm from internal side walls thereof.

* * * * *